June 12, 1956 R. R. LAW ET AL 2,750,507

TRANSISTOR OSCILLATOR CIRCUIT

Filed June 3, 1953

INVENTORS
Russell R. Law,
Harwick Johnson,
Lawrence J. Giacoletto &
Loy E. Barton
BY H. L. Newton
ATTORNEY 2,750,507

TRANSISTOR OSCILLATOR CIRCUIT

Russell R. Law, Wenham, Mass., and Harwick Johnson, Princeton, Lawrence J. Giacoletto, Princeton Junction, and Loy E. Barton, Princeton, N. J., assignors to Radio Corporation of America, a corporation of Delaware Application June 3, 1953, Serial No. 359,324

10 Claims. (Cl. 250—36)

Figure 1:
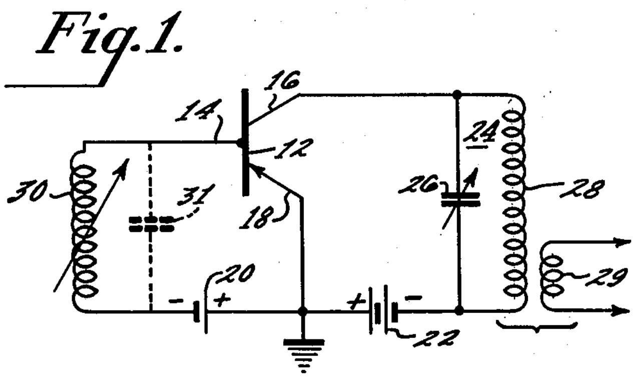

This invention relates to electrical signal generators or oscillator circuits and in particular to such circuits utilizing semi-conductor devices.

The recent development of commercially useful semi-conductor devices of the type employing a semi-conductive element having three contacting electrodes has already had a decided effect upon, and has caused the introduction of many new techniques in the electric signal communication field. These devices, known extensively as "transistors," are small in size, especially when compared with the ordinary vacuum tube, require no heater power, are very durable, and consist of materials which appear to have a long useful life. Therefore, the use of transistors for oscillator, as well as other, circuits has been the subject of some investigation.

Transistors, as is well known, are of two general classes which are known as the point-contact transistor and the junction transistor. However, each of these classes are known to exhibit different characteristics which have made one class preferable to the other for certain circuit applications.

The current gain of junction transistors, as defined by the ratio of collector electrode current to emitter electrode current, is less than unity. This characteristic of the junction type transistor has apparently made its application to oscillator circuits less desirable than the point-contact type. Point-contact transistors, as is well known in the art, may be current multiplication devices and may, under certain conditions, exhibit a negative resistance. Thus, oscillators have been designed using point-contact transistors which do not require an external feedback path. Heretofore, however, it has been considered necessary to provide an external feedback path to sustain oscillations in those circuits utilizing junction transistors.

Recent developments have indicated that junction transistors are preferred in radio signal communication systems of all types. Thus, in some superheterodyne receiving systems the various amplifying and signal detection stages may all use junction type transistors. Because of the simplicity of known point-contact transistor oscillator circuits, however, the receiver may utilize oscillator circuits of this latter type. It is obvious, of course, that the exclusive use of one type of transistor in a receiver, whether it be of the point-contact or junction type, is a decided advantage. Obviously, such a receiver simplifies repair procedures when transistors need replacing. In addition, it permits the various transistor units to be normally interchangeable.

In addition to these advantages that might be realized from the exclusive use of junction type transistors in a receiver, the relative stability of the characteristics of the junction transistors themselves recommends them for radio frequency circuit applications. It has been found, for example, that due to the stability of the characteristics of junction transistors, their performance may be predicted with relative accuracy in various circuit applications.

It is, accordingly, an object of the present invention to provide an improved oscillator circuit which utilizes a semi-conductor device having a current gain less than unity.

It is a further object of the present invention to provide an improved signal generator circuit of the type utilizing a junction transistor.

It is still another object of the present invention to provide a semi-conductor oscillator circuit utilizing a transistor of the junction type for sustaining oscillations, and wherein external feedback means may be eliminated.

These and further objects of the present invention are achieved by utilizing a junction transistor connected for grounded emitter operation as one of the elements in an oscillator circuit. The frequency determining element of the oscillator comprises a parallel resonant circuit which is connected in the collector circuit of the transistor. To sustain oscillations, provision is made in the base electrode circuit of the transistor to provide a suitable phase shift.

Figure 2:
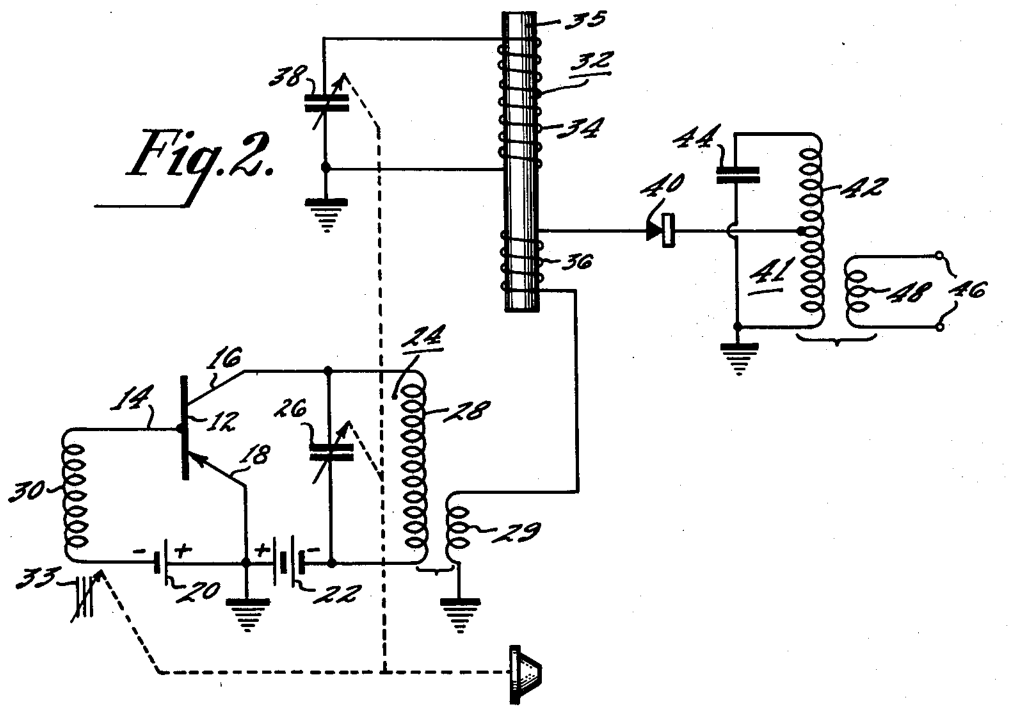

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit digaram of a transistor oscillator circuit connected in accordance with the present invention; and Figure 2 is a schematic circuit diagram of the radio-frequency section of a signal receiver embodying the oscillator of Figure 1 in accordance with the invention.

Referring now to the drawing, wherein like elements are designated by like reference numerals throughout the figures, and particularly to Figure 1, the oscillator circuit includes a transistor 10 comprising a semi-conductive body 12 having three contacting electrodes. Thus, the body 12 has a base electrode 14, a collector electrode 16, and an emitter electrode 18.

The transistor 10 is illustrated, by way of example, as being a junction transistor of the P–N–P type, although it should be understood that by reversing the polarities of the biasing potentials an N–P–N type could also be used. When using a transistor of the P–N–P type, the collector electrode 16 will be in contact with one P-type zone, the base electrode 14 will be in contact with the N-type zone and the emitter electrode 18 will be in contact with the other P-type zone.

The transistor 10 is connected in the oscillator circuit for grounded emitter operation. Thus, the emitter electrode 18 is common to both the input and the output circuits of the transistor and may be connected, for that reason, to the common return element of the system such as chassis ground as indicated. To supply proper operating biases for such operation, two batteries 20 and 22 are provided as shown. The battery 20 may be connected to provide a small negative voltage such as, for example, 0.1 volt to the base electrode 14, while the battery 22 may be connected to provide a slightly larger negative voltage such as, for example, 6 volts to the collector electrode 16. By connecting the batteries as shown, as is well known and understood, the bias between the base electrode 14 and the emitter electrode 16 will be in a conducting polarity or in a forward direction which is the direction of easy current flow. The bias between the base electrode 14 and the collector electrode 18 will, on the other hand, be in a reverse direction or in a relatively non-conducting polarity.

In accordance with the present invention, the frequency-determining circuit or tuning means for the oscillator comprises a parallel resonant or tank circuit 24 which is connected between the collector electrode 16 of the transistor and the negative terminal of battery 22. The tank circuit 24 may comprise a variable capacitor 26 in parallel with an inductor 28 which provides a conductive connection between the biasing battery 22 and the collector electrode 16. The resonant frequency of the tank circuit 24 and therefore the frequency of oscillation, is adjusted by variation of the capacitor 26, in the present example.

To complete the oscillator circuit, and further in accordance with the present invention, a variable inductor 30, which may have distributed capacitance 31, is connected as a phase shifting element between the base electrode 14 and the negative terminal of the battery 20. The tuning of the base-emitter circuit is then adjusted for stabilized oscillation generation at the frequency determined by the tank circuit 24, by varying the inductor 30. It has been found that when so adjusted the circuit operation is extremely stable over the range of operating frequencies. Output signal energy may be derived from the oscillator tank circuit, as the output circuit, by any suitable coupling thereto, as by an output coupling coil 29 inductively coupled, as shown, to the tuning inductor 28.

While it will be understood that the circuit specifications may vary according to the design for any particular application, the following circuit specifications are included by way of example only. It has been found that by assigning voltage values of 0.1 and 6 volts to the batteries 20 and 22 respectively, and using a P–N–P junction type transistor, the circuit will oscillate at a frequency of approximately 455 kc. if these specifications are used.

| | |
|---|---|
| Inductor **30** | 15 microhenries. |
| Capacitor **26** | 300 micro-microfarads. |
| Inductor **28** | 438 microhenries. |

It is believed that certain capacitance relations exist in the semi-conducting body of a junction transistor between the collector and emitter electrodes and the base electrode. The oscillator circuit of the present invention utilizes this characteristic of junction transistors to advantage. Accordingly, it appears that with the circuit connections shown, a portion of the oscillator signal energy appearing in the output or tank circuit 24 of the transistor, and of sufficient strength to sustain oscillations, may be fed back through the semi-conducting body to the input circuit of the device. Thus, it has been found that with this improved oscillator circuit an external feedback circuit is not needed to obtain sustained oscillations and stable operation over a relatively wide range of frequencies.

As is well known and understood, the signal energy that is fed back to the input circuit of an oscillator must be of proper phase and magnitude in order to compensate for normal circuit losses and thereby sustain oscillations. In most cases, the phase requirements are satisfied when the currents that are fed back to the input circuit of the oscillator are in phase with the currents in the input circuit.

In accordance with the present invention, it has been found that the currents thus fed back through the electrodes of the semi-conducting body of a junction transistor will apparently be of proper phase to satisfy the requirements for oscillation if a suitable impedance element is connected with the base electrode. Thus, it has been found, by way of example, that an inductor, such as the inductor 30, when connected in series between the base electrode and the negative terminal of the battery 20 and the ground or common connection between the base and emitter, in combination with the distributed capacitance 31 of the inductor windings, does produce a phase shift necessary to sustain oscillations.

From the foregoing description it will be seen that the circuit illustrated in Figure 1 embodies these principles in a practical oscillator circuit. By adjusting the value of the capacitor 26, the resonant frequency of the tank circuit 24 and the operating frequency of the oscillators may be varied. The circuit has been found to oscillate at a frequency approximately equal to the resonant frequency of the tank circuit. As explained above, a portion of the current in the collector electrode output circuit is fed back, without external or additional feedback means, to the base electrode circuit of the oscillator. In this circuit, by adjusting the impedance of the inductor 30, it has been found that the phase of the currents that are fed back may be adjusted to satisfy the conditions necessary for sustained and stable oscillation.

The oscillator circuit which comprises the present invention may find wide application in electronic communication circuits of all types. Thus, it may find application as a source of fixed frequency oscillations and may be used in this connection, for example, as a frequency multiplier in a signal transmitter. It is also apparent that this type of oscillator circuit may be used as the local oscillator in a superheterodyne receiver.

Thus, for example, in Figure 2, the oscillator signals appearing in the inductor 28 of the oscillator tank circuit 24 may be conductively coupled through the output coil 29, and serially therefrom through a coupling winding 36 of a loop antenna 32 to the anode of a crystal diode 40 acting as the mixer or first detector of the receiver. One terminal of the coupling or output coil is grounded as indicated.

The oscillator circuit may further be identical with that of Figure 1 and is so shown in Figure 2. Therefore, the frequency of the oscillatory energy is varied by the variable capacitor 26 in the tank circuit 24, and phase shift for sustained oscillations is obtained by varying the impedance of the inductor 30 which is connected in series between the emitter 18 and the base 14 of the transistor 10. In the present example, the inductor 30 is provided with a movable tuning core element 33 representing any suitable means for varying the inductance or impedance thereof.

The loop antenna 32 may comprise a ferro magnetic core or rod 36 which has signal pickup winding 34 mounted thereon in inductively coupled relation to the coupling winding 36. The antenna winding 34 is tuned for response to incoming signals by a variable capacitor 38 connected in shunt relation thereto as shown.

The cathode of the heterodyne crystal mixer 40 is connected to a low impedance matching tap on a tuning inductor 42 of a frequency selective or resonant intermediate frequency output circuit 41. To form a parallel resonant circuit which is resonant at the selected intermediate or beat frequency, the inductor 42 is shunted by a tuning capacitor 44. The output or intermediate frequency signal may be obtained from suitable terminals 46 of an intermediate frequency output inductor 48 inductively coupled to the inductor 42 as shown.

Incoming signals induced in the loop antenna 32 are applied through the winding 36 to the crystal mixer 40 where they are heterodyned with local oscillator signals from the coil 29, to produce beat or intermediate frequency signals which may here be assumed to have a frequency corresponding to both the sum or difference of the signal frequency and the oscillator frequency. The resonant circuit 41 may therefore be tuned to the difference frequency, and conveys the intermediate frequency resultant signal to the output terminals 43 for further amplification as is well known.

As described herein, an improved oscillator circuit in accordance with the invention, employs a junction transistor which does not require the provision of an external feedback path. The invention provides a relatively stable circuit which utilizes a minimum of circuit elements, thus achieving simplicity with reliability.

What is claimed is:

1. In an oscillator circuit including a point of reference potential therein the combination comprising a semi-conductor device having a semi-conductive body, a base electrode, a collector electrode, and an emitter electrode in contact therewith, said device being characterized by a current gain of less than unity and effective capacity coupling in said body between said electrodes, means for applying biasing potentials to said electrodes, means connecting said emitter electrode with said point of reference potential, a frequency determining circuit for said oscillator connected between said emitter and collector electrodes and tunable for response to an alternating current of predetermined frequency, and means for controlling in combination with said capacity coupling the alternating current flow between said base and emitter electrodes in adjusted phase relation with said first named current for sustained and stable oscillation including a reactive circuit element serially connected between said base and emitter electrodes.

2. An oscillator as defined in claim 1 wherein said reactive element is an inductor having inherent distributed capacity controlling the frequency response thereof.

3. An oscillator as defined in claim 2 wherein said frequency determining circuit is a parallel resonant circuit comprising a tuning inductor and shunt capacity means therefor.

4. In an oscillator circuit including a point of reference potential therein, the combination with a semi-conductor device of the junction type having a semi-conductive body, a base electrode, a collector electrode, and an emitter electrode in contact therewith, said device being characterized by an effective capacitance in said body between said electrodes, of means for applying a bias between said base electrode and said emitter electrode in a relatively conducting polarity and for applying a bias between said base electrode and said collector electrode in a relatively non-conducting polarity, means connecting said emitter electrode with said point of reference potential, a frequency-determining circuit connected between said collector and emitter electrodes and responsive to alternating currents of a predetermined frequency therebetween, a reactive element connected between said base and emitter electrodes, said element providing in combination with said effective capacitance alternating current flow between said base and emitter electrodes in such phase relation to said first named current and of a magnitude as to sustain oscillations at said predetermined frequency.

5. In a radio receiver including a point of ground potential therein, a tunable local oscillator comprising a semi-conductor device having a semi-conductive body, a base electrode, a collector electrode, and an emitter electrode in contact therewith, said device being characterized by a current gain of less than unity and a reactive effect in said body between said emitter and base electrodes, energizing means including a source of operating bias connected with said electrodes, means connecting said emitter electrode with said point of ground potential, a variably tunable oscillator output circuit connected with said emitter and collector electrodes providing alternating current response in a predetermined frequency range, and a variable inductive reactance element serially connected between said base and emitter electrodes providing in combination with said reactive effect an alternating current flow between said base and emitter electrodes substantially in such phase relation with said first named current to supply feedback energy to said device for sustained oscillation without external feedback means.

6. In an oscillator circuit including a source of reference potential therein, the combination comprising a semi-conductor device of the junction type and having a semi-conductive body, a base electrode, a collector electrode, and an emitter electrode in contact therewith, means including a source of operating bias voltage for biasing said electrodes, means connecting said emitter electrode with said source of reference potential, a frequency determining circuit connected with said emitter and collector electrodes and responsive to an alternating current of predetermined frequency therebetween, and an inductor serially connected between said base and emitter electrodes for providing an alternating current flow between said base and emitter electrodes in such phase relation to said first named current to sustain oscillations at said predetermined frequency.

7. A tunable oscillator circuit including a point of reference potential therein and comprising a semi-conductor device having a semi-conductive body, a base electrode, a collector electrode, and an emitter electrode in contact therewith, said device being characterized by a current gain of less than unity, energizing means for applying a bias between said base electrode and said emitter electrode in a relatively conducting polarity and a bias between said base electrode and said collector electrode in a relatively non-conducting polarity, means coupling said emitter electrode with said point of reference potential, a parallel-resonant circuit connected between said collector and emitter electrodes providing a first alternating current of predetermined frequency therebetween, and a reactive circuit element connected between said base and emitter electrodes for providing a second alternating current flow therebetween, said reactive element being variable whereby the phase relation between said first and second alternating currents supplies sufficient feedback energy to said device for sustained oscillation.

8. In a radio receiver including a point of ground potential therein, a tunable local oscillator comprising a semi-conductor device having a semi-conductive body, a base electrode, a collector electrode, and an emitter electrode in contact therewith, said device having a current gain of less than unity, said body providing a capacity coupling effect between said electrodes, means including a source of operating bias voltage for biasing said electrodes, means connecting said emitter electrode with said point of ground potential, a frequency determining circuit connected with said emitter and collector electrodes providing alternating current flow at a predetermined frequency therebetween, and an impedance element having a predetermined value serially connected between said base and emitter electrodes to provide with said capacity coupling effect an alternating current between said base and emitter electrodes substantially in adjusted phase relation with respect to said first named current whereby energy is supplied to said device for sustained oscillation at said predetermined frequency.

9. An oscillator as defined in claim 8 wherein the impedance element is a variable inductor having inherent distributed capacity at said frequency for tuning response at said frequency.

10. In an oscillator generator including a ground connection therein the combination comprising a semi-conductor device of the junction type and having a semi-conductive body, a base electrode, a collector electrode, and an emitter electrode in contact therewith, said device being characterized by capacity effects in said body between said electrodes, means including a source of operating bias voltage for biasing said electrodes to an operating level, means connecting said emitter electrode with said ground connection, a parallel resonant circuit connected with said emitter and collector electrodes providing an alternating current of predetermined frequency therebetween, and an inductor having distributed capacity and inductance serially connected between said base and emitter electrodes to convey alternating current between said base and emitter electrodes in magnitude and phase relation with respect to said first named current whereby energy is supplied to said device for sustained oscillation at said predetermined frequency.

References Cited in the file of this patent

UNITED STATES PATENTS

| | | |
|---|---|---|
| 2,556,296 | Rack | June 12, 1951 |
| 2,569,347 | Shockley | Sept. 25, 1951 |